United States Patent
Pöchmüller

(10) Patent No.: US 6,295,237 B1
(45) Date of Patent: Sep. 25, 2001

(54) SEMICONDUCTOR MEMORY CONFIGURATION WITH A BUILT-IN-SELF-TEST

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/553,127

(22) Filed: Apr. 19, 2000

(30) Foreign Application Priority Data

Apr. 19, 1999 (DE) .............................. 199 17 588

(51) Int. Cl.[7] .................................................. G11C 7/00
(52) U.S. Cl. ................................................. 365/201
(58) Field of Search ................................. 365/200, 201; 714/7, 8, 6, 10, 11

(56) References Cited

U.S. PATENT DOCUMENTS 6,065,134 * 5/2000 Bair et al. ................................. 714/7
6,085,334 * 7/2000 Giles et al. ................................ 714/8

FOREIGN PATENT DOCUMENTS 198 20 442
A1  11/1998 (DE) .

* cited by examiner

Primary Examiner—Vu A. Le
(74) Attorney, Agent, or Firm—Herbert L. Lerner; Laurence A. Greenberg; Werner H. Stemer

(57) ABSTRACT

A semiconductor memory configuration, in particular a DRAM, in which redundant memory cells, bit lines and word lines are determined for failed memory cells, failed word lines and failed bit lines by a built-in-self-test computing unit and a special algorithm.

4 Claims, 2 Drawing Sheets

| #Hit | Y-Adresse | X-Adresse | #Hit |
|---|---|---|---|
| 1 | 803 | 250 | 1 |
| 1 | 630 | 799 | 1 |
|  |  |  |  |
|  |  |  |  |
|  |  |  |  |

| #Hit | Y-Adresse | X-Adresse | #Hit |
|---|---|---|---|
| 2 | 803 | 250 | 1 |
| 1 | 630 | 799 | 1 |
| 2 | 803 | 730 | 1 |
| 1 | 402 | 128 | 1 |
| 1 | 0 | 512 | 3 |

| #Hit | Y-Adresse | X-Adresse | #Hit |
|---|---|---|---|
| 2 | 803 | 250 | 1 |
| 1 | 630 | 799 | 1 |
| 2 | 803 | 730 | 1 |
| 1 | 402 | 128 | 1 |
| 1 | 0 | 512 | 3 |
| 3 | 112 | 0 | 1 |

SEMICONDUCTOR MEMORY CONFIGURATION WITH A BUILT-IN-SELF-TEST

BACKGROUND OF THE INVENTION

Field of the Invention

The present invention relates to a semiconductor memory configuration addressed via word lines and bit lines and having a memory cell array containing a multiplicity of memory cells and redundant memory cells. The redundant memory cells, in the event of failure of the memory cells of the memory cell array, replace the memory cells as spare memory cells, the memory cells of the memory cell array and the spare memory cells being provided on a semiconductor chip.

Semiconductor memory configurations, such as, for example dynamic random access memories (DRAMs), cannot, in practice, be fabricated without failure of memory cells in the memory cell array. This is primarily due to the impinging of undesirable particles during wafer processing in the course of the fabrication of the semiconductor memory configuration, and also to other reasons, such as short circuits, etc. In order to be able to overcome the problems associated with this, therefore, use is generally made of redundant memory cells with redundant bit lines and word lines which can replace memory cells that have failed in this way.

In practice the procedure is such that after the fabrication of a DRAM, still at the wafer level, a test is performed which is intended to localize all failed memory cells of the DRAM. Such failed memory cells may be individual memory cells, groups of memory cells or even complete bit lines and word lines with the corresponding memory cells. Once the failed memory cells have been identified, which is done via a corresponding addressing, the addresses of the failed memory cells and, if appropriate, groups of memory cells and also word lines and bit lines are stored in an external computer. The external computer then carries out a complicated calculation involving the failed memory cells, on the one hand, and the available spare memory cells, on the other hand. In this case, "memory cells" should, of course, also be understood to be groups of memory cells and also, if appropriate, entire word lines and bit lines with corresponding memory cells. This calculation determines how the failed memory cells can be replaced by the spare memory cells in an optimum manner. The calculation is extremely complex, this being due in no small part to the fact that the highest possible yield is striven for. In other words, the failed memory cells are intended to be replaced by the redundant memory cells in such a way that as few redundant memory cells as possible are required, that is to say that the number of spare memory cells is intended to be kept small.

On account of the complicated calculation, to date no thought has been given to using built-in-self-test (BIST) technologies precisely in the case of DRAMs, even though BIST per se has been used for a relatively long time in microelectronics. This is because with BIST, the necessary calculations for optimum use of the redundant memory cells instead of the failed memory cells cannot be performed without a great deal of area being taken up on the wafer. In other words, these calculations presuppose a BIST computing unit, the area requirement of that by far exceeds the acceptable amount in the context of fabricating DRAMs.

Thus, a problem is presented which at first sight appears to be irresolvable. In the context of assigning the redundant memory cells as spare memory cells to the failed memory cells, the use of an external computer is complicated and should be avoided if possible. Recourse to the inherently widespread BIST technology is not possible, however, since using this technology would result in taking up too much area on the wafer of the semiconductor memory configuration. For this reason, to date no thought has been given to using BIST technology in the context of fabricating DRAMs in order to replace failed memory cells by redundant memory cells.

SUMMARY OF THE INVENTION

It is accordingly an object of the invention to provide a semiconductor memory configuration with a built-in-self-test that overcomes the above-mentioned disadvantages of the prior art devices of this general type, which, without a complicated external computer, is none the less able to replace failed memory cells with redundant memory cells.

With the foregoing and other objects in view there is provided, in accordance with the invention, a semiconductor memory configuration, including:

a semiconductor chip;

word lines disposed on the semiconductor chip;

bit lines disposed on the semiconductor chip;

a memory cell array disposed on the semiconductor chip and addressed via the word lines and the bit lines, the memory cell array having a multiplicity of memory cells;

redundant memory cells disposed on the semiconductor chip and addressed by the word lines and the bit lines, the redundant memory cells in an event of failed memory cells of the memory cell array replace the failed memory cells as spare memory cells; and a built-in-self-test computing unit disposed on the semiconductor chip and connected to the memory cell array and the redundant memory cells, the BIST computing unit assigning the spare memory cells to the failed memory cells, the BIST computing unit having a register for storing addresses of the word lines and the bit lines of the failed memory cells, the BIST computing unit having a counter and, for each of the addresses, the counter increments a number relating to the failed memory cells as a hit value up to an upper limit, a corresponding one of the word lines or the bit lines being replaced in an event of the upper limit being exceeded.

The object of the invention is achieved by virtue of the fact that a BIST computing unit is provided in the semiconductor chip, which computing unit assigns spare memory cells to the failed memory cells.

In this case, a particular algorithm is used for this assignment, in which the algorithm, for example, a number of failed memory cells is stored as a hit value for each address. If the hit value reaches a specific limit, then the entire word line (X-direction) or bit line (Y-direction) associated with this address is replaced. Individual defects can otherwise be replaced optionally by a word line or a bit line.

The BIST computing unit has, in particular, a register in which the addresses of the failed memory cells can be stored for the individual word lines and bit lines. The register may, for example, be configured as a stack register and act as an associative memory.

To summarize, therefore, in the case of the memory cell configuration according to the invention, the address information for failed memory cells is not stored in an external memory but rather on the semiconductor chip itself in registers. With the aid of a special algorithm, the number of required registers can be kept small in this case. The BIST computing unit then specifies the redundant memory cells that repair the failed memory cells as spare memory cells.

In this way, the semiconductor memory configuration according to the invention does not require an external computer and succeeds with a manageable number of register entries, which results in that only a small amount of chip area is required for the realization thereof. Since the address information of the failed memory cells is stored in real time, high-speed processing is possible which, in particular, also does not necessitate an interruption during a test pass. Furthermore, it is possible to accumulate information about failed memory cells for a plurality of individual test passes in the registers.

If different failed memory cells are present on the same bit line or word line, then the provision of a counter unit which, for each X-address and Y-address, stores the number of failed memory cells as a hit value up to an upper limit makes it possible to restrict the information to be recorded which would occur when a multiplicity of failed memory cells occurred in the same bit line or word line.

Finally, the configuration of the register as an associative memory also has a favorable effect on attaining a high operating speed.

Other features which are considered as characteristic for the invention are set forth in the appended claims.

Although the invention is illustrated and described herein as embodied in a semiconductor memory configuration with a built-in-self-test, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
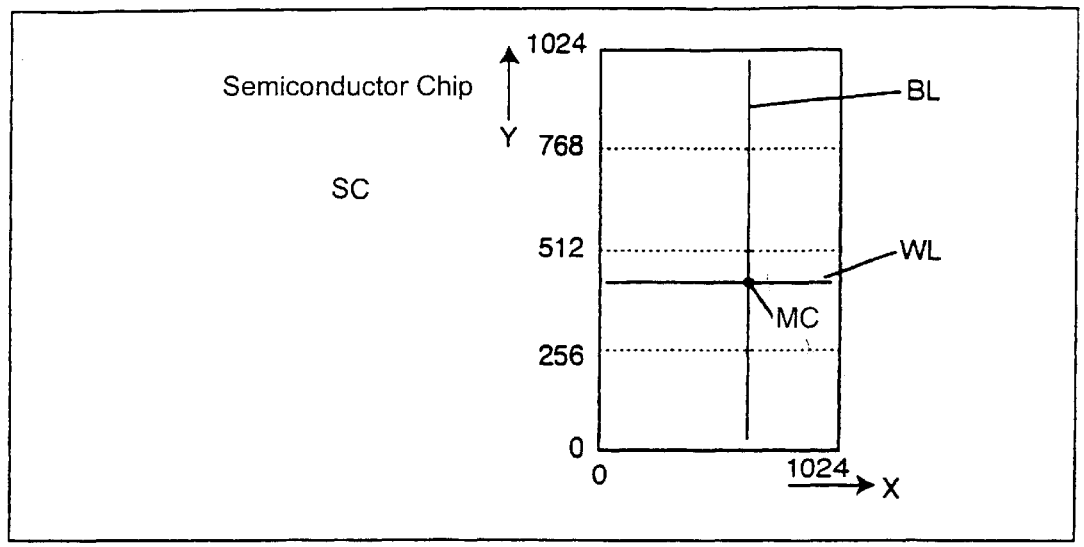
FIG. 1 is a basic illustration of a memory cell array in a semiconductor memory configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a memory cell array of a DRAM containing 1024 word lines in an X-direction and 1024 bit lines in a Y-direction disposed on a semiconductor chip SC. A memory cell MC is provided at each point of intersection of a word line with a bit line. Therefore, the memory cell array thus present has 1024×1024 memory cells and consequently forms a 1 Mb memory configuration. In FIG. 1, one of the bit lines BL and one of the word lines WL are shown by solid lines in order to simplify the illustration.

Suppose, then, that different redundant bit lines and redundant word lines are available in order to replace any failed memory cells. Such failed memory cells can be determined by tests involving the driving of the individual word lines and bit lines which lead to the respective memory cells.

A complete test sequence at the wafer level for identifying failed memory cells in this case consists of a large number of individual tests. For simplification purposes suppose, then, that just three tests A, B and C are performed in a complete test sequence, as is illustrated in FIG. 2.

Figure 2:
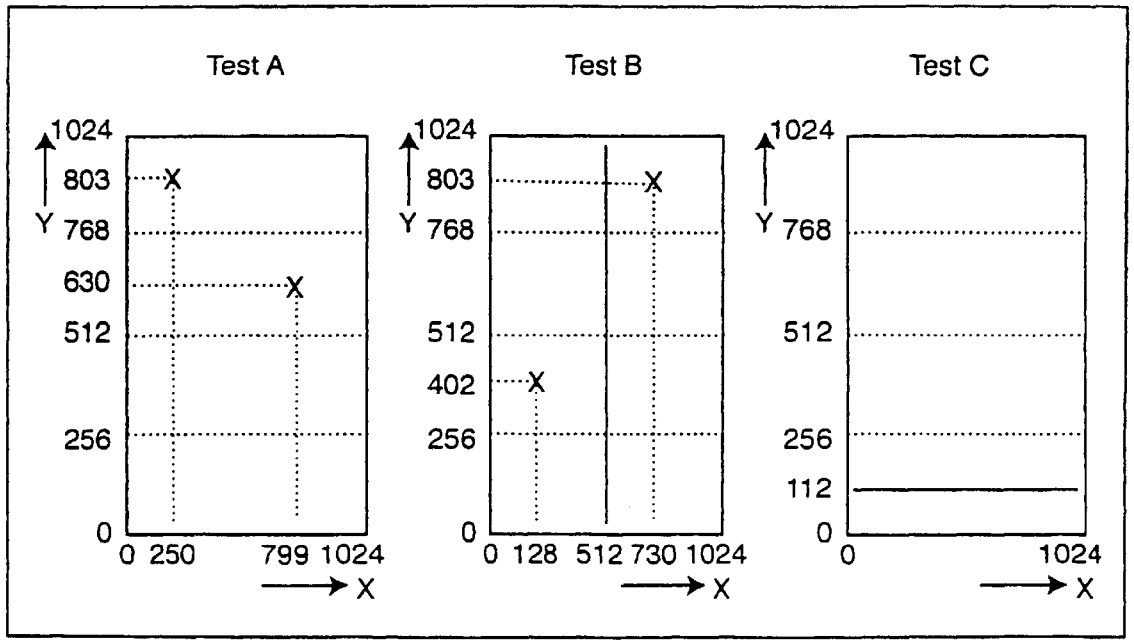
FIG. 2 is an illustration of a sequence of three tests.
Figures 3, 4, 5, 6:
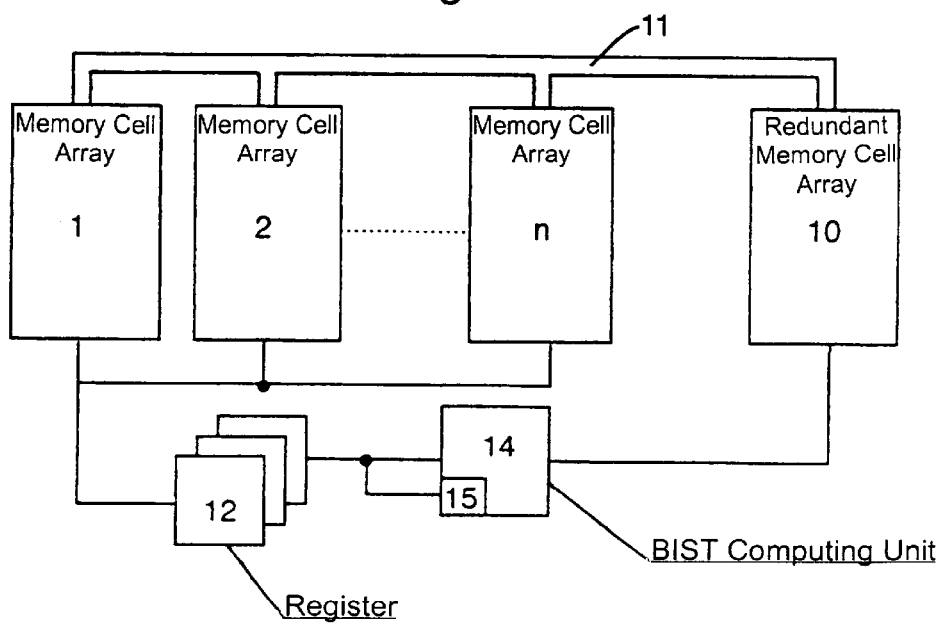
FIGS. 3 to 5 are tables showing hit values obtained during the tests carried out with reference to FIG. 2.
FIG. 6 is a block diagram of a structure of the semiconductor memory configuration.

FIG. 2 represents an example here, in which different memory cells or bits are determined as defective after respective tests A, B and C have been carried out. In this case, two failed or defective bits are determined in a first test A, two individual failed bits and a failed bit line are ascertained in a second test B, and a complete word line is ascertained as defective in the last test C. The addresses of the respective defective bits, bit lines and word lines are stored in a register while the tests are carried out in real time. FIG. 3 reveals the contents of such a register after the first test has been carried out.

During test A, a first failed bit is ascertained at a location 803/250. Since there is no similar entry at 803 or 250, this failure is stored with a hit value 1 under the Y-address 803 and with a hit value 1 under the X-address 250. The same also applies to a failure at the location 630/799: the hit value 1 is stored under the Y-address 630, while the hit value 1 is likewise recorded under the X-address 799.

Test B then follows. An individual failed memory cell shall be ascertained here at 803/730. For the case where the same address pair is already stored in the register, the respective hit values should each be incremented by 1. In the present case, then, only the row address 803 is already present. Therefore 803/730 is entered into the register and the hit value for the Y-address 803 is incremented to 2, since there are now two "hits" at this Y-address 803.

In test B a further defective memory cell is determined at the location 402/128 in a similar manner to the locations 803/250 and 630/799 of test A.

A special case arises, however, in test B for a defective bit line at X/512. In the event of customary evaluation, such a defective bit line would lead to an excessively large register which would encompass 1024 stacks in the present case. However, this can be avoided in the semiconductor memory configuration according to the invention by the application of a special algorithm: whenever the hit value exceeds a certain threshold value, which may be 3 for example, it is assumed that a complete spare column or spare row must be used. In other words, if, therefore, for example 3 or more hits occur for a Y-address and 3 or more hits occur for an X-address, the entire column or row is "automatically" replaced by a bit line or word line.

This process will be briefly explained below. Suppose, for example, that the first failed bit on the defective bit line is ascertained at 0/512. This value is then entered into the register. The next failure may then be determined at 1/512, for example. This value is also entered into the register, and the hit value at the Y-address 512 is increased to 2. After the detection of the third failure on this bit line at 2/512, for example, the above-mentioned threshold value of 3 is reached. It is thus clear that a spare column must be used for repairing the failed bit line. It then suffices to hold the single entry for the column 512 in the register at the hit value 3, while the remaining entries can be removed. FIG. 4 thus shows the final contents of the register after the conclusion of test B.

Finally, suppose that a failed word line is ascertained at X/112 in the last test C. Exactly the same algorithm as has been explained above for the bit line Y/512 then leads to register contents as shown in FIG. 5.

The information about failed memory cell or bit lines and word lines which is obtained after tests A, B and C can then be evaluated in order to determine the best possible assignment of spare memory cells or spare columns and spare rows, in order to replace all the failed memory cells or bit lines and word lines by redundant memory cells or bit lines and word lines. This calculation can readily be performed in a BIST computing unit on the semiconductor chip SC or else externally.

In the example of the hit value 3, there is no degree of freedom in the replacement by a spare bit line or a spare word line. Thus, hit=3 for the X-address signifies that a spare bit line must be used.

The register may advantageously be configured as an associative memory. Each hit value is represented by at least two bits, and about thirteen bits per address require approximately twenty bits for a single entry in the register. Such an associative behavior can be realized by in the order of 20 NAND gates and 20 XOR gates with two inputs per register entry.

The register requires a capacity which suffices to store the entire information of the failed memory cells, that is to say at most the total number of the redundant bit lines and of the redundant word lines.

If appropriate, however, it is also possible to store only results of individual tests in the registers and to store intermediate results in each case in the DRAM that is still defective. For example, after test A has been performed, in the above example the intermediate results are stored in the defective DRAM itself. As soon as test B has been concluded, the results of test A are updated with the results of test B and are stored instead of the results of test A in the DRAM. The register is thus free again for the results of test C. This procedure can be continued in a corresponding manner. It is also possible, of course, to develop suitable methods for redundant storage of the information in the defective DRAM itself.

FIG. 6 shows a block diagram for realizing the semiconductor memory configuration according to the invention. The latter contains a multiplicity of memory cell arrays 1, 2, . . . , n. Each of the memory cell arrays 1, 2, . . . , n is constructed in the manner as shown in FIG. 1, for example. In this case, it is possible to provide the redundant bit lines and the word lines with the corresponding memory cells in each of the memory cell arrays 1, 2, . . . , n. Likewise, however, it is also possible to accommodate the redundant bit lines and the word lines with the corresponding memory cells in a separate memory cell array 10.

In a test, the individual memory cell arrays are checked by driving their word lines and bit lines in order to determine defective memory cells, word lines and bit lines, as has been explained above. The results of this test are stored in a register 12. However, it is also possible to store the results in the defective DRAM itself. Thus, by way of example, when the memory array 1 is being tested, the results can be stored in the as yet untested memory array 10. This does, however, presuppose highly redundant storage of the information. A built-in-self-test (BIST) computing unit 14 with a counter unit 15 for counting the hit values up to an upper limit then evaluates the results of the tests. The results finally being stored in the registers 12, after the conclusion of the tests and determines those redundant memory cells, bit lines and word lines which, as the spare memory cells, spare bit lines and spare word lines from the memory cell array 10, are intended to replace the defective memory cells, bit lines and word lines in the memory cell arrays 1, 2, . . . , n. The replacement of the memory cells, the bit lines and the word lines is effected, for example, via corresponding bus lines 11, which connect the individual memory cell arrays to one another.

I claim:

1. A semiconductor memory configuration, comprising:
   a semiconductor chip;
   word lines disposed on said miconductor chip;
   bit lines disposed on said semiconductor chip;
   a memory cell array disposed on said semiconductor chip and addressed via said word lines and said bit lines, said memory cell array having a multiplicity of memory cells;
   redundant memory cells disposed on said semiconductor chip and addressed by said word lines and said bit lines, said redundant memory cells in an event of failed memory cells of said memory cell array replace said failed memory cells as spare memory cells; and
   a built-in-self-test computing unit disposed on said semiconductor chip and connected to said memory cell array and said redundant memory cells, said BIST computing unit assigning said spare memory cells to said failed memory cells, said BIST computing unit having a register for storing addresses of said word lines and said bit lines of said failed memory cells, said BIST computing unit having a counter and, for each of the addresses, said counter increments a number relating to said failed memory cells as a hit value up to an upper limit, a corresponding one of said word lines or said bit lines being replaced in an event of the upper limit being exceeded.

2. The semiconductor memory configuration according to claim 1, wherein said register is a stack register.

3. The semiconductor memory configuration according to claim 2, wherein said stack register is formed as an associative memory.

4. The semiconductor memory configuration according to claim 1, wherein said register is assigned a defective part of said memory cell array in which partial results of tests can be stored.

* * * * *